(12) United States Patent
Obata (10) Patent No.: US 12,206,430 B2
(45) Date of Patent: Jan. 21, 2025

(54) A/D CONVERTER

(71) Applicant: Panasonic Intellectual Property Management Co., Ltd., Osaka (JP)

(72) Inventor: Koji Obata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 144 days.

(21) Appl. No.: 18/022,071

(22) PCT Filed: Jun. 15, 2021

(86) PCT No.: PCT/JP2021/022660
§ 371 (c)(1),
(2) Date: Feb. 17, 2023

(87) PCT Pub. No.: WO2022/044491
PCT Pub. Date: Mar. 3, 2022

(65) Prior Publication Data
US 2023/0370083 A1    Nov. 16, 2023

(30) Foreign Application Priority Data
Aug. 28, 2020  (JP) .................................. 2020-145080

(51) Int. Cl.
*H03M 1/46* (2006.01)
(52) U.S. Cl.
CPC ..................................... *H03M 1/46* (2013.01)
(58) Field of Classification Search
CPC .... H03M 1/46; H03M 1/0626; H03M 1/0854; H03M 1/468; H03M 1/426
See application file for complete search history.

(56) References Cited

U.S. PATENT DOCUMENTS

| 4,034,364 | A | * | 7/1977 | Fukuda | .................. | H03M 1/52 |
| | | | | | | 341/158 |
| 6,075,478 | A | * | 6/2000 | Abe | ...................... | H03M 1/002 |
| | | | | | | 341/155 |

(Continued)

FOREIGN PATENT DOCUMENTS

| JP | 2002-232292 A | 8/2002 |
| JP | 2017-147712 A | 8/2017 |
| JP | 2019-121850 A | 7/2019 |

OTHER PUBLICATIONS

International Search Report dated Jul. 20, 2021 issued in International Patent Application No. PCT/JP2021/022660, with English translation.

(Continued)

*Primary Examiner* — Lam T Mai
(74) *Attorney, Agent, or Firm* — Rimon P.C.

(57) ABSTRACT

A comparator compares a differential voltage between a voltage to be converted as an analog input voltage and a comparative voltage generated by a D/A converting unit with a comparison reference voltage. A switching circuit selectively connects a capacitor, associated with the analog input voltage selected as the voltage to be converted, to an output terminal of an integrator. The integrator integrates the differential voltage in a state where an A/D converting section has performed conversion operation on a least significant bit. A comparison reference voltage generating unit uses, as the comparison reference voltage, a charge voltage for the capacitor associated with the analog input voltage selected as the voltage to be converted.

15 Claims, 3 Drawing Sheets

(56) References Cited

U.S. PATENT DOCUMENTS

| | | | | |
|---|---|---|---|---|
| 6,087,970 | A * | 7/2000 | Panicacci | H03M 1/02 |
| | | | | 341/172 |
| 9,197,240 | B1 * | 11/2015 | Kinyua | H03M 1/0626 |
| 9,467,159 | B1 * | 10/2016 | Tai | H03M 1/1057 |
| 9,998,131 | B1 * | 6/2018 | Kinyua | H03F 3/45237 |
| 10,447,291 | B1 * | 10/2019 | Thomas | H03M 1/1245 |
| 10,998,913 | B2 * | 5/2021 | Buelow | H03M 1/109 |
| 2011/0234441 | A1 * | 9/2011 | Makihara | H03M 1/1225 |
| | | | | 341/172 |
| 2013/0229295 | A1 * | 9/2013 | Yamada | H03M 1/34 |
| | | | | 341/158 |
| 2014/0285370 | A1 * | 9/2014 | Miki | H03M 1/08 |
| | | | | 341/172 |
| 2015/0256190 | A1 * | 9/2015 | Takayama | H03M 1/1033 |
| | | | | 341/118 |
| 2015/0372691 | A1 | 12/2015 | Mandal | |
| 2016/0072515 | A1 | 3/2016 | Kinyua | |
| 2016/0226507 | A1 * | 8/2016 | Baek | H03M 1/1245 |
| 2016/0352351 | A1 * | 12/2016 | Miki | H03M 1/0626 |
| 2019/0207621 | A1 | 7/2019 | Tanaka et al. | |
| 2020/0228128 | A1 * | 7/2020 | Huang | H03K 5/2472 |
| 2020/0252077 | A1 * | 8/2020 | Kulkarni | H03M 1/468 |
| 2023/0291413 | A1 * | 9/2023 | Park | H03M 1/38 |
| 2023/0387929 | A1 * | 11/2023 | Sedighi | H03M 1/164 |

OTHER PUBLICATIONS

Extended European Search Report dated Jan. 31, 2024 issued in the corresponding European Patent Application No. 21860922.0.
Obata Koji et al. Jun. 15, 2016 (Jun. 15, 2016). "A 97.99 dB SNDR, 2 kHz BW, 37.1 μW noise-shaping SAR ADC with dynamic element matching and modulation dither effect". 2016 IEEE Symposium on VLSI Circuits (VLSI-Circuits), IEEE, XP032969241, DOI: 10.1109/VLSIC.2016.7573463, pp. 1-2.

* cited by examiner

A/D CONVERTER

CROSS-REFERENCE OF RELATED APPLICATIONS

This application is the U.S. National Phase under 35 U.S.C. § 371 of International Patent Application No. PCT/JP2021/022660, filed on Jun. 15, 2021, which in turn claims the benefit of Japanese Patent Application No. 2020-145080, filed on Aug. 28, 2020, the entire disclosures of which Applications are incorporated by reference herein.

TECHNICAL FIELD

The present disclosure generally relates to an analog-to-digital (A/D) converter, and more particularly relates to a successive approximation register (SAR) A/D converter.

BACKGROUND ART

Patent Literature 1 discloses a noise-shaping SAR A/D converter. The noise-shaping SAR A/D converter has a configuration in which an integrating circuit is provided as an additional constituent element for a normal SAR A/D converter. In the noise-shaping SAR A/D converter, after a successive approximation operation has been performed through the least significant bit, the residual voltages of a digital-to-analog (D/A) converter are integrated, and the resultant integrated value is fed back when sampling is performed next time, thus achieving a noise-shaping characteristic for shifting noise in a low-frequency band to a high-frequency band. Then, Patent Literature 1 enables increasing the resolution of the A/D converter by having the noise that has been shifted to the high-frequency band attenuated by a low-pass filter.

The noise-shaping SAR A/D converter feeds back the integrated value of the residual voltages when sampling is performed next time. Thus, the noise-shaping SAR A/D converter of Patent Literature 1 cannot be used to A/D convert a plurality of analog input voltages time-sequentially.

CITATION LIST

Patent Literature

Patent Literature 1: JP 2017-147712 A

SUMMARY OF INVENTION

It is therefore an object of the present disclosure to provide an A/D converter with the ability to A/D convert a plurality of analog input voltages time-sequentially while reducing a conversion error.

An A/D converter according to an aspect of the present disclosure includes an input switching circuit and a successive approximation register A/D converting section. The input switching circuit receives a plurality of analog input voltages and outputs, as a voltage to be converted, one analog input voltage selected from the plurality of analog input voltages. The A/D converting section performs A/D conversion of converting the voltage to be converted, supplied from the input switching circuit, into a multi-bit digital signal. The input switching circuit selects, when a conversion operation of converting the voltage to be converted has been performed by the A/D converting section, another analog input voltage, as the voltage to be converted, from the plurality of analog input voltages. The A/D converting section performs the conversion operation on a target bit basis from a most significant bit through a least significant bit. The A/D converting section includes a control unit, a D/A converting unit, a comparison reference voltage generating unit, and a comparator. The D/A converting unit generates an analog comparative voltage, corresponding to the target bit, in accordance with a control signal supplied from the control unit. The comparison reference voltage generating unit generates a comparison reference voltage corresponding to the analog input voltage selected as the voltage to be converted. The comparator determines a value of the target bit by comparing a differential voltage between the voltage to be converted and the comparative voltage with the comparison reference voltage. The control unit determines, based on a result of comparison made by the comparator with respect to the target bit, the control signal with respect to a bit next to the target bit. The comparison reference voltage generating unit includes an integrator, a plurality of capacitors, and a switching circuit. The integrator integrates the differential voltage in a state where the A/D converting section has performed the conversion operation on the least significant bit. The plurality of capacitors are provided in association with the plurality of analog input voltages, respectively. The switching circuit selectively connects a capacitor, associated with the analog input voltage selected as the voltage to be converted, out of the plurality of capacitors to an output terminal of the integrator. The capacitor, connected to the output terminal of the integrator via the switching circuit, out of the plurality of capacitors is charged with an output voltage of the integrator. The comparison reference voltage generating unit uses, as the comparison reference voltage, a charge voltage for the capacitor, associated with the analog input voltage selected as the voltage to be converted, out of the plurality of capacitors.

DESCRIPTION OF EMBODIMENTS

Embodiment (1) Overview

Figure 1:
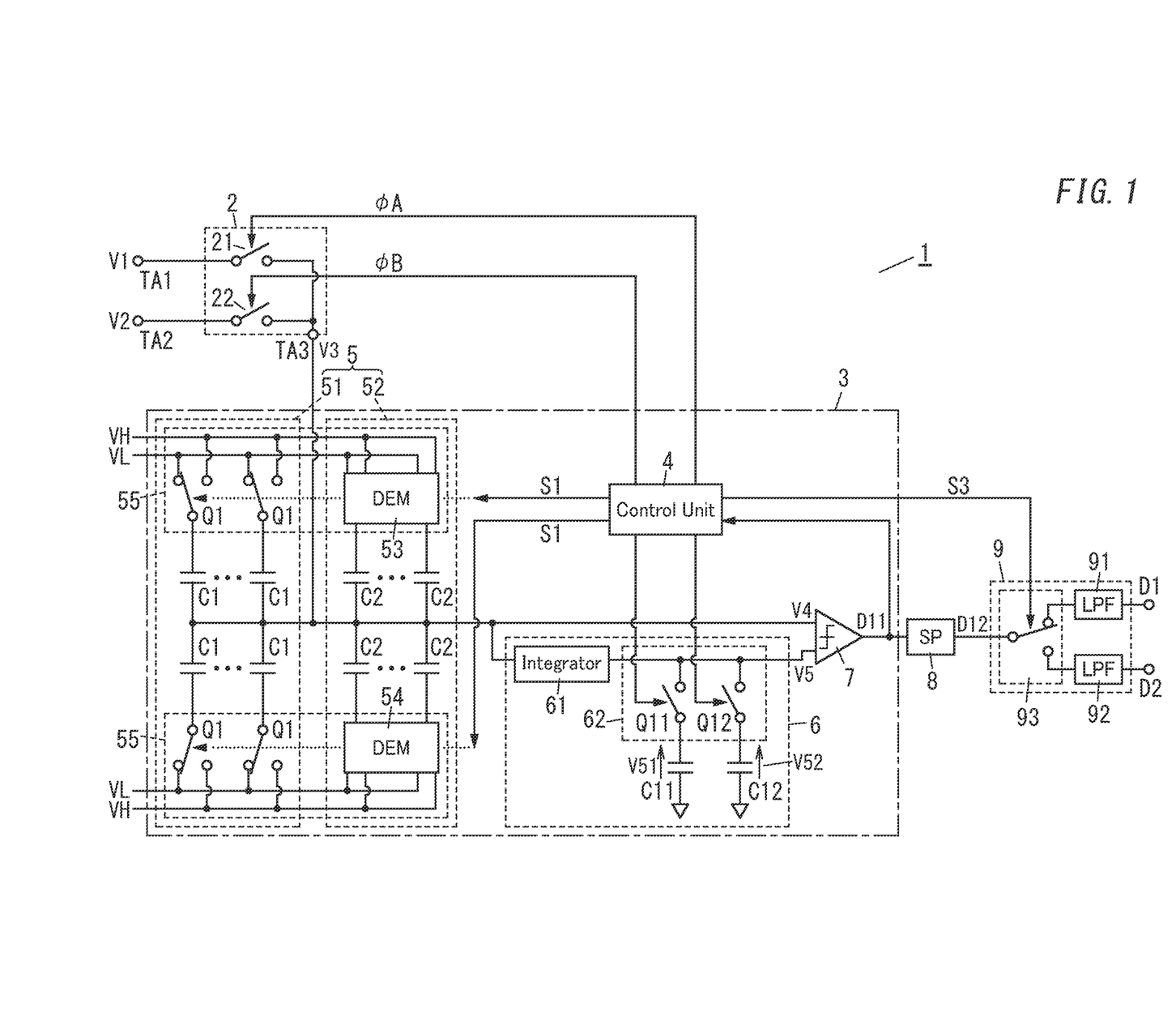
FIG. 1 is a schematic circuit diagram of an A/D converter according to an exemplary embodiment of the present disclosure.

As shown in FIG. 1, an A/D converter 1 according to an exemplary embodiment includes an input switching circuit 2 and a successive approximation register (SAR) A/D converting section 3. Note that the A/D converting section 3 according to this embodiment is a noise-shaping SAR A/D converting section having a configuration in which an integrating circuit is provided as an additional constituent element for the SAR A/D converting section.

The input switching circuit 2 receives a plurality of analog input voltages (e.g., two analog input voltages V1, V2 in FIG. 1) and outputs, as a voltage V3 to be converted, one analog input voltage selected from the plurality of analog input voltages. The A/D converting section 3 performs A/D conversion of converting the voltage V3 to be converted, supplied from the input switching circuit 2, into a multi-bit digital signal (D1 or D2). The input switching circuit 2 selects, when a conversion operation of converting the voltage V3 to be converted has been performed by the A/D converting section 3, another analog input voltage, as the voltage V3 to be converted, from the plurality of analog input voltages.

The A/D converting section 3 performs the conversion operation on a target bit basis from a most significant bit through a least significant bit. The A/D converting section 3 includes a control unit 4, a D/A converting unit 5, a comparison reference voltage generating unit 6, and a comparator 7.

The D/A converting unit 5 generates an analog comparative voltage with respect to a target bit in accordance with a control signal S1 supplied from the control unit 4. In other words, the D/A converting unit 5 generates an analog comparative voltage, corresponding to the target bit, in accordance with the control signal S1 supplied from the control unit 4. The analog comparative voltage corresponding to the target bit is an analog voltage corresponding to a digital signal. The values of the digital signal from the most significant bit thereof through a bit which is more significant by one than the target bit are determined by the comparator 7. The value of the target bit of the digital signal is "1." The value of the bit next to the target bit of the digital signal through the least significant bit thereof is "0."

The comparison reference voltage generating unit 6 generates a comparison reference voltage V5 corresponding to the analog input voltage that has been selected as the voltage V3 to be converted.

The comparator 7 determines a value of the target bit by comparing a differential voltage V4 between the voltage V3 to be converted and the comparative voltage with the comparison reference voltage V5.

The control unit 4 determines, based on a result of comparison made by the comparator 7 with respect to the target bit, the control signal S1 with respect to the bit next to the target bit. In other words, the control unit 4 determines, based on a result of comparison made by the comparator 7 with respect to the target bit, a comparative voltage to be generated by the D/A converting unit 5 with respect to the bit next to the target bit and also determines the control signal S1 to generate the comparative voltage thus determined.

The comparison reference voltage generating unit 6 includes an integrator 61, a plurality of (e.g., two in the example shown in FIG. 1) capacitors C11, C12, and a switching circuit 62.

The integrator 61 integrates the differential voltage V4 in a state where the A/D converting section 3 has performed the conversion operation on the least significant bit. The plurality of capacitors C11, C12 are provided in association with the plurality of analog input voltages V1, V2, respectively. The switching circuit 62 selectively connects a capacitor C11 or C12, associated with the analog input voltage V1 or V2 selected as the voltage V3 to be converted, out of the plurality of capacitors C11, C12 to an output terminal of the integrator 61. The capacitor C11 or C12, connected to the output terminal of the integrator 61 via the switching circuit 62, out of the plurality of capacitors C11, C12 is charged with an output voltage of the integrator 61. The comparison reference voltage generating unit 6 uses, as the comparison reference voltage V5, a charge voltage for the capacitor C11 or C12, associated with the analog input voltage V1 or V2 selected as the voltage V3 to be converted, out of the plurality of capacitors C11, C12.

In the A/D converter 1 according to this embodiment, the input switching circuit 2 selects, when a conversion operation of converting the voltage V3 to be converted has been performed by the A/D converting section 3, another analog input voltage, as the voltage V3 to be converted, from the plurality of analog input voltages V1, V2. Thus, the A/D converter 1 may A/D convert the plurality of analog input voltages V1, V2 time-sequentially. In addition, the A/D converter 1 according to this embodiment includes a plurality of capacitors C11, C12 associated with the plurality of analog input voltages V1, V2, respectively. Furthermore, each of the plurality of capacitors C11, C12 is charged with the result of integration performed by the integrator 61 in a situation where an associated analog input voltage V1, V2 is used as the voltage V3 to be converted. The charge voltage V51, V52 for the capacitor C11, C12 is used as the comparison reference voltage V5 when the associated analog input voltage V1, V2 is A/D converted next time. Thus, the conversion error may be reduced by using an integrated value of the conversion error involved with the A/D conversion as the comparison reference voltage V5 for the next A/D conversion. This enables providing an A/D converter 1 with the ability to A/D convert the plurality of analog input voltages time-sequentially while reducing the conversion error.

In the exemplary embodiment to be described below, a situation where the input switching circuit 2 receives two analog input voltages V1, V2 and the A/D converter 1 alternately A/D converts the two analog input voltages V1, V2 time-sequentially will be described as an example. Note that the number of the analog input voltages supplied to the input switching circuit 2 does not have to be two. Alternatively, three or more analog input voltages may be supplied to the input switching circuit 2 and the A/D converter 1 may A/D convert three or more analog input voltages time-sequentially.

(2) Details (2.1) Configuration

Figure 2:
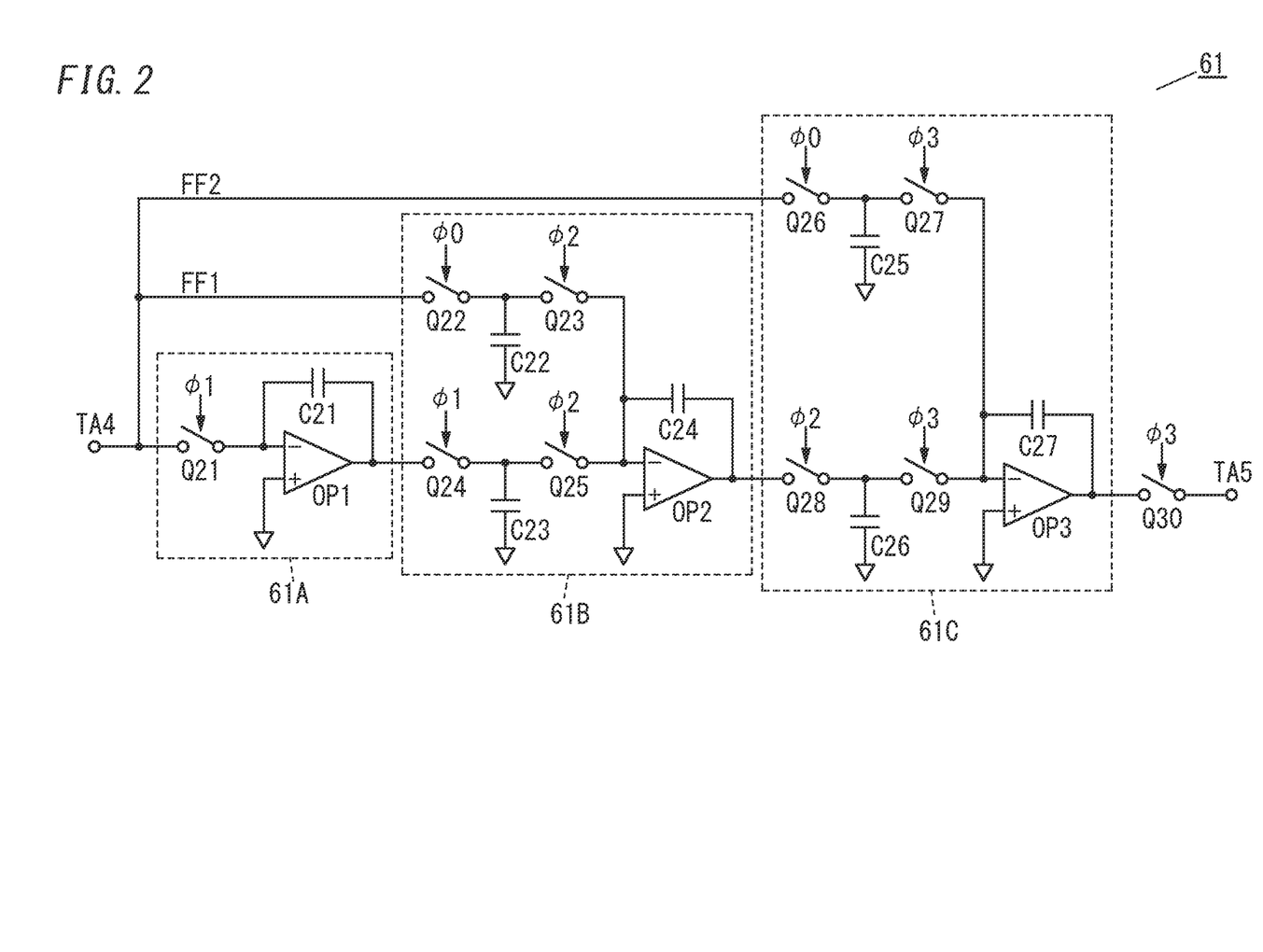
FIG. 2 is a schematic circuit diagram illustrating an exemplary integrator included in the A/D converter.

Next, a configuration for an A/D converter 1 according to this embodiment will be described in further detail with reference to FIGS. 1 and 2. Note that FIGS. 1 and 2 are schematic circuit diagrams of the A/D converter 1, of which the circuit configuration is illustrated in a simplified form with illustration of some components thereof omitted.

The A/D converter 1 according to this embodiment is a noise-shaping successive approximation register (SAR) A/D converter. The A/D converter 1 includes the input switching circuit 2 and the A/D converting section 3 as described above. In addition, the A/D converter 1 according to this embodiment includes not only the input switching circuit 2 and the A/D converting section 3 but also input terminals TA1, TA2, a serial-parallel converting unit (abbreviated as "SP" in FIG. 1) 8, and a filter circuit 9 as well. As used herein, the "terminal" may naturally refer to a part (terminal) to which an electric wire, for example, is connected, but may also be a lead of an electronic component or a part of a conductor formed as wiring on a circuit board.

The input terminal TA1 receives an analog input voltage V1 and the input terminal TA2 receives an analog input voltage V2. The analog input voltages V1, V2 may be, for example, output signals of various types of sensors such as acceleration sensors, angular velocity sensors, or gyrosensors.

An output terminal TA3 of the input switching circuit 2 is connected to one input terminal of the comparator 7. The input switching circuit 2 includes a switch 21 connected between the input terminal TA1 and the output terminal TA3 and a switch 22 connected between the input terminal TA2 and the output terminal TA3. The switches 21, 22 may be, for example, semiconductor switches such as CMOS transistors and are turned ON and OFF in accordance with control signals φA, φB supplied from the control unit 4. When the switch 21 turns ON and the switch 22 turns OFF, the analog input voltage V1 is supplied as the voltage V3 to be converted from the input switching circuit 2 to the A/D converting section 3. On the other hand, when the switch 21 turns OFF and the switch 22 turns ON, the analog input voltage V2 is supplied as the voltage V3 to be converted from the input switching circuit 2 to the A/D converting section 3.

The A/D converting section 3 includes the control unit 4, the D/A converting unit 5, the comparison reference voltage generating unit 6, and the comparator 7.

The control unit 4 may be implemented as a wired logic, for example. The control unit 4 makes the A/D converter 1 A/D convert the analog input voltages V1, V2 alternately and time-sequentially by controlling the operations of the input switching circuit 2, the D/A converting unit 5, the comparison reference voltage generating unit 6, and the filter circuit 9. Alternatively, the control unit 4 may also be implemented as a computer system including one or more processors and a memory.

The D/A converting unit 5 may be a 12-bit D/A converting unit, for example, and may be implemented as a combination of a low-order D/A converting unit 51 for the least significant four bits and a high-order D/A converting unit 52 for the most significant eight bits.

The D/A converting unit 5 is a capacitive D/A converting unit including a plurality of capacitors C1, C2 and a voltage switching circuit 55. Each of the plurality of capacitors C1, C2 has one terminal thereof connected to the output terminal TA3 of the input switching circuit 2. The voltage switching circuit 55 selectively connects the other terminal of each of the plurality of capacitors C1, C2 to either a first voltage VH or a second voltage VL in accordance with the control signal S1 supplied from the control unit 4. The D/A converting unit 5 is a capacitive D/A converting unit including the plurality of capacitors C1, C2 and the voltage switching circuit 55. This achieves the advantage of making the D/A converting unit 5 implementable as a simple circuit. The first voltage VH and the second voltage VL are DC voltages each having a constant voltage value. The first voltage VH is set at a voltage higher than the second voltage VL.

The low-order D/A converting unit 51 includes a plurality of capacitors C1 and a plurality of switches Q1 provided for the plurality of capacitors C1, respectively. Each of the plurality of capacitors C1 has one terminal thereof connected to the output terminal TA3 of the input switching circuit 2. The plurality of switches Q1 may be implemented as, for example, semiconductor switches such as CMOS transistors. The plurality of switches Q1 each selectively connect an associated one of the plurality of capacitors C1 to either the first voltage VH or the second voltage VL in accordance with the control signal S1 supplied from the control unit 4.

On the other hand, the high-order D/A converting unit 52 includes a plurality of capacitors C2 and dynamic element matching (DEM) circuits 53, 54. Each of the plurality of capacitors C2 has one terminal thereof connected to the output terminal TA3 of the input switching circuit 2. The plurality of DEM circuits 53, 54 each selectively connect an associated one of the plurality of capacitors C2 to either the first voltage VH or the second voltage VL in accordance with the control signal S1 supplied from the control unit 4.

In this embodiment, the voltage switching circuit 55 is formed by the plurality of switches Q1 and the DEM circuits 53, 54. The plurality of switches Q1 and the DEM circuits 53, 54 selectively connect each of the plurality of capacitors C1, C2 to either the first voltage VH or the second voltage VL in accordance with the control signal S1 supplied from the control unit 4. This allows the D/A converting unit 5 to generate a comparative voltage with a desired voltage value. In this embodiment, the output terminal of the D/A converting unit 5 is connected, as well as the output terminal TA3 of the input switching circuit 2, to one input terminal of the comparator 7. This allows the differential voltage V4 between the voltage V3 to be converted supplied from the input switching circuit 2 and the comparative voltage generated by the D/A converting unit 5 to be supplied to the one input terminal of the comparator 7.

The comparison reference voltage generating unit 6 includes the integrator 61, the plurality of (e.g., two in this embodiment which is as many as the analog input voltages V1, V2) capacitors C11, C12, and the switching circuit 62.

FIG. 2 illustrates a specific exemplary circuit configuration for the integrator 61. The integrator 61 according to this embodiment includes multiple stages of integrating circuits 61A, 61B, 61C for performing integration operations sequentially. These multiple stages of integrating circuits 61A-61C perform integration operations using operational amplifiers OP1-OP3, respectively.

The integrating circuit 61A is an integrating circuit on the first stage. The integrating circuit 61A includes the operational amplifier OP1, a capacitor C21, and a switch Q21. An inverting input terminal of the operational amplifier OP1 is connected to an input terminal TA4 of the integrator 61 via the switch Q21. The capacitor C21 is connected between the inverting input terminal and output terminal of the operational amplifier OP1. A non-inverting input terminal of the operational amplifier OP1 is connected to a reference voltage for the A/D converter 1. In this embodiment, the integrating circuit 61A is formed by the operational amplifier OP1, a capacitor of the D/A converting unit 5 connected to the input terminal TA4, and the capacitor C21. The output terminal of the operational amplifier OP1 (i.e., an output terminal of the integrating circuit 61A) is connected to an input terminal of the integrating circuit 61B.

The integrating circuit 61B is an integrating circuit on the second stage. The integrating circuit 61B includes the operational amplifier OP2, capacitors C22-C24, and switches Q22-Q25. An inverting input terminal of the operational amplifier OP2 is connected to the input terminal TA4 of the integrator 61 via the switches Q22, Q23. In addition, the inverting input terminal of the operational amplifier OP2 is also connected to the output terminal of the integrating circuit 61A via the switches Q24, Q25. A non-inverting input terminal of the operational amplifier OP2 is connected to a reference potential for the A/D converter 1. In this embodiment, a node of connection between the switches Q22, Q23 is connected to the reference voltage for the A/D converter 1 via the capacitor C22. A node of connection between the switches Q24, Q25 is connected to the reference voltage for the A/D converter 1 via the capacitor C23. The capacitor C24 is connected between the inverting input terminal and output terminal of the operational amplifier OP2. The output terminal of the operational amplifier OP2 (i.e., an output terminal of the integrating circuit 61B) is connected to an input terminal of the integrating circuit 61C.

In this embodiment, a feed forward path FF1 is formed between the input terminal TA4 of the integrator 61 and the input terminal of the operational amplifier OP2 included in the integrating circuit 61B on the second stage. The differential voltage V4 supplied through the input terminal TA4 of the integrator 61 is sampled by the capacitor C22. As a result, the differential voltage V4 thus sampled is supplied to the operational amplifier OP2 of the integrating circuit 61B on the second stage.

The integrating circuit 61C is an integrating circuit on the third stage. The integrating circuit 61C includes an operational amplifier OP3, capacitors C25-C27, and switches Q26-Q29. An inverting input terminal of the operational amplifier OP3 is connected to the input terminal TA4 of the integrator 61 via the switches Q26, Q27. In addition, the inverting input terminal of the operational amplifier OP3 is also connected to the output terminal of the integrating circuit 61B (i.e., the output terminal of the operational amplifier OP2) via the switches Q28, Q29. A non-inverting input terminal of the operational amplifier OP3 is connected to the reference potential for the A/D converter 1. In this embodiment, a node of connection between the switches Q26, Q27 is connected to the reference voltage for the A/D converter 1 via the capacitor C25. A node of connection between the switches Q28, Q29 is connected to the reference voltage for the A/D converter 1 via the capacitor C26. The capacitor C27 is connected between the inverting input terminal and output terminal of the operational amplifier OP3.

In this embodiment, a feed forward path FF2 is formed between the input terminal TA4 of the integrator 61 and the input terminal of the operational amplifier OP3 included in the integrating circuit 61C on the third stage. The differential voltage V4 supplied through the input terminal TA4 of the integrator 61 is sampled by the capacitor C25. As a result, the differential voltage V4 thus sampled is supplied to the operational amplifier OP3 of the integrating circuit 61C on the third stage.

An output terminal of the integrating circuit 61C (i.e., an output terminal of the operational amplifier OP3) is electrically connected to an output terminal TA5 of the integrator 61 via a switch Q30. That is to say, the output terminal of the integrating circuit 61C is connected to the switching circuit 62.

The plurality of switches Q21-Q30 may be implemented as, for example, semiconductor switches such as CMOS transistors. The switches Q22, Q26 are turned ON or OFF in accordance with a control signal $\varphi 0$ supplied from the control unit 4. The switches Q21, Q24 are turned ON or OFF in accordance with a control signal $\varphi 1$ supplied from the control unit 4. The switches Q23, Q25, Q28 are turned ON or OFF in accordance with a control signal $\varphi 2$ supplied from the control unit 4. The switches Q27, Q29, Q30 are turned ON or OFF in accordance with a control signal $\varphi 3$ supplied from the control unit 4.

As can be seen, in the example illustrated in FIG. 2, the three integrating circuits 61A, 61B, 61C are cascade connected in the integrator 61 and these integrating circuits 61A-61C on three stages perform integration operations sequentially, thereby realizing the noise shaping characteristic for shifting noise in a low-frequency band to a high-frequency band. In the integrator 61 according to this embodiment, the three integrating circuits 61A, 61B, 61C are cascade connected. However, this is only an example and should not be construed as limiting. Alternatively, the number of stages of the integrating circuits may be changed as appropriate as long as there is at least one stage. In addition, in a situation where the number of stages of the integrating circuits is two or more, the feed forward path does not have to be formed between the input terminal TA4 of the integrator 61 and the one or more integrating circuits to be connected from the second stage and on. The feed forward path may be omitted as appropriate.

The plurality of (e.g., two in this embodiment) capacitors C11, C12 are provided in association with the plurality of (e.g., two in this embodiment) analog input voltages V1, V2, respectively. Each of the plurality of capacitors C11, C12 has one terminal thereof connected to the reference voltage for the A/D converter 1. The switching circuit 62 includes the plurality of (e.g., two in this embodiment) switches Q11, Q12, which are respectively connected between the other terminals of the plurality of capacitors C11, C12 and the output terminal of the integrator 61. That is to say, the output terminal of the capacitor C11 is connected to the output terminal TA5 of the integrator 61 and an input terminal of the comparator 7 via the switch Q11. The output terminal of the capacitor C12 is connected to the output terminal TA5 of the integrator 61 and the input terminal of the comparator 7 via the switch Q12. The switches Q11, Q12 may be implemented as semiconductor switches such as CMOS transistors. The switches Q11, Q12 are turned ON and OFF in accordance with the control signal supplied from the control unit 4.

The comparator 7 compares, on a target bit basis, the voltage supplied from the D/A converting unit 5 (i.e., the differential voltage V4 between the voltage V3 to be converted and the output voltage of the D/A converting unit 5) with the comparison reference voltage V5 supplied via the switching circuit 62. The comparator 7 determines the value (which is either 0 or 1) of the target bit by comparing the differential voltage V4 between the voltage V3 to be converted and the output voltage of the D/A converting unit 5 with the comparison reference voltage V5 on a target bit basis.

When setting the analog input voltage V1 as the voltage V3 to be converted, the control unit 4 turns the switch Q11 ON and turns the switch Q12 OFF and uses the charge voltage V51 for the capacitor C11 as the comparison reference voltage V5 and supplies the voltage V51 to the other input terminal of the comparator 7. Thus, when the analog input voltage V1 is A/D converted, the result of integration, obtained by having the differential voltage V4, remaining when the least significant bit is converted during the A/D conversion last time, integrated by the integrator 61, is used as the comparison reference voltage V5. As a result, the noise shaping characteristic for shifting noise in the low-frequency band to the high-frequency band is realized.

On the other hand, when setting the analog input voltage V2 as the voltage V3 to be converted, the control unit 4 turns the switch Q11 OFF and turns the switch Q12 ON and uses the charge voltage V52 for the capacitor C12 as the comparison reference voltage V5 and supplies the voltage V52 to the other input terminal of the comparator 7. Thus, when the analog input voltage V2 is A/D converted, the result of integration, obtained by having the differential voltage V4, remaining when the least significant bit is converted during the A/D conversion last time, integrated by the integrator 61, is used as the comparison reference voltage V5. As a result, the noise shaping characteristic for shifting noise in the low-frequency band to the high-frequency band is realized.

In addition, the control unit 4 also generates, based on the result of comparison made by the comparator 7 on the target bit, a control signal S1 to make the D/A converting unit 5 generate a comparative voltage for the bit next to the target bit and outputs the control signal S1 to the D/A converting unit 5 when performing the comparison operation on the next bit.

The serial-parallel converting unit 8 converts a serial digital signal D11 supplied from the A/D converting section 3 into a parallel digital signal D12 and outputs the digital signal D12 thus converted to the filter circuit 9 while A/D converting the voltage V3 to be converted.

The filter circuit 9 attenuates RF components of the digital signal supplied from the A/D converting section 3 (in this embodiment, the digital signal D12 that has been converted into a parallel signal). This filter circuit 9 includes a plurality of filters (which are abbreviated as "LPF" in FIG. 1) 91, 92 and a filter switching circuit 93. The plurality of filters 91, 92 are associated with the plurality of analog input voltages V1, V2, respectively. The filter switching circuit 93 supplies the digital signal D12 to one filter, associated with the analog input voltage selected as the voltage V3 to be converted, out of the plurality of filters 91, 92.

Each of the filters 91, 92 is a digital filter having a low-pass filtering characteristic and attenuates RF components included in the digital signal D12. Each of these filters 91, 92 may be a digital filter implemented as a wired logic, for example, but may also be implemented as a processor. The filter switching circuit 93 connects, in accordance with a control signal S3 supplied from the control unit 4, an output terminal of the serial-parallel converting unit 8 to one of the two filters 91, 92. When the analog input voltage V1 is used as the voltage V3 to be converted, the control unit 4 controls the filter switching circuit 93 such that the digital signal D12 is supplied to the filter 91 associated with the analog input voltage V1. On the other hand, when the analog input voltage V2 is used as the voltage V3 to be converted, the control unit 4 controls the filter switching circuit 93 such that the digital signal D12 is supplied to the filter 92 associated with the analog input voltage V2.

This allows, when the analog input voltage V1 is supplied to the A/D converting section 3, the digital signal D11 output from the A/D converting section 3 to be converted by the serial-parallel converting unit 8 into a parallel digital signal D12 which is then supplied to the filter 91. Then, a digital signal D1, generated by having the RF components included in the digital signal D12 attenuated by the filter 91, is output from the A/D converter 1.

In addition, this also allows, when the analog input voltage V2 is supplied to the A/D converting section 3, the digital signal D11 output from the A/D converting section 3 to be converted by the serial-parallel converting unit 8 into a parallel digital signal D12, which is then supplied to the filter 92. Then, a digital signal D2, generated by having the RF components included in the digital signal D12 attenuated by the filter 92, is output from the A/D converter 1.

(2.2) Description of Operation

Next, it will be described with reference to FIG. 3 and other drawings how the A/D converter 1 according to this embodiment operates.

Figure 3:
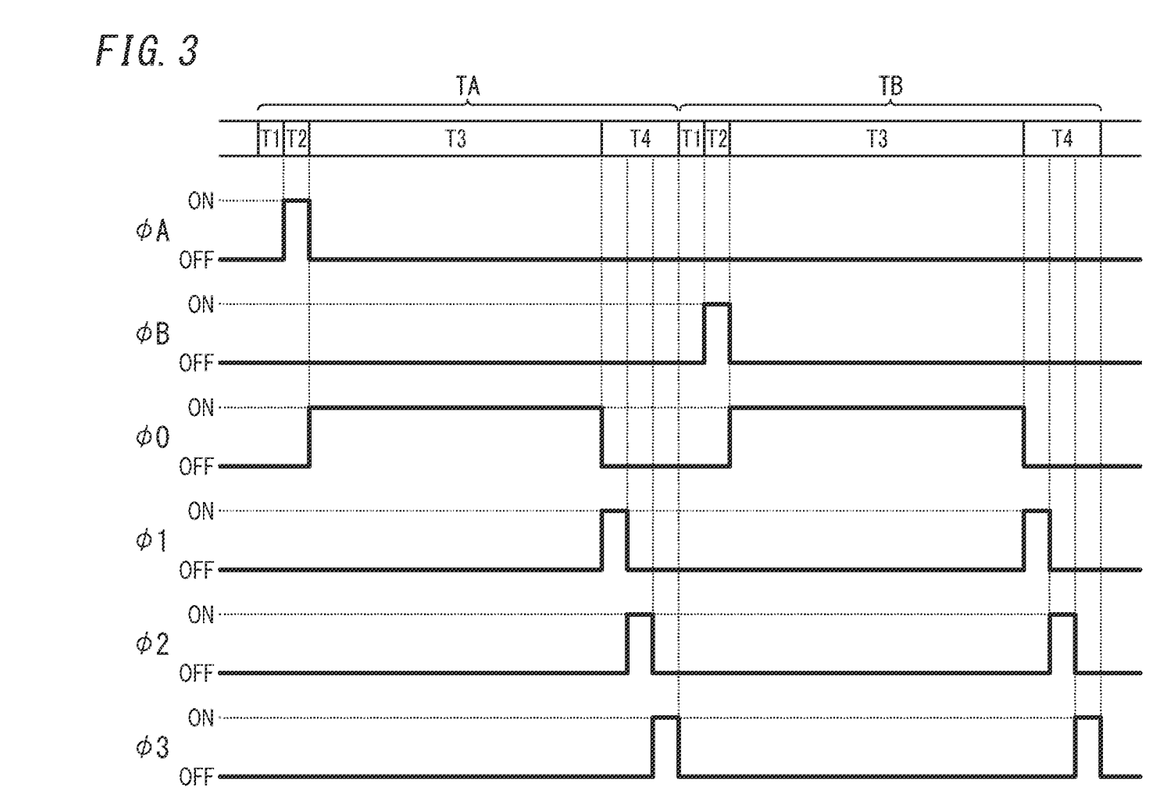
FIG. 3 is a timing chart illustrating how the A/D converter operates.

FIG. 3 is an exemplary timing chart illustrating how the A/D converter 1 shown in FIGS. 1 and 2 may operate. Note that FIG. 3 is a timing chart illustrating the operation of some components of the A/D converter 1. Next, it will be described with reference to FIGS. 1-3 how the A/D converter 1 operates.

A control signal φA is a control signal for the switch 21. A control signal φ3 is a control signal for the switch 22. Also, control signals φ0, φ1, φ2, φ3 are control signals for the switches Q21-Q30 included in the integrator 61. The control signals φA, φB and φ0-φ3 are supplied from the control unit 4.

The control unit 4 A/D converts the two analog input voltages V1, V2 time-sequentially by alternately setting a first period TA in which the control unit 4 A/D converts the analog input voltage V1 and a second period TB in which the control unit 4 A/D converts the analog input voltage V2.

First, it will be described how the A/D converter 1 operates in the first period TA. During a reset period T1 of the first period TA, the control unit 4 controls the switch Q1 to perform a reset operation on the capacitors C1, C2 included in the D/A converting unit 5. In addition, in the first period TA, the control unit 4 turns the switch Q11 ON and turns the switch Q12 OFF and uses the charge voltage V51 for the capacitor C11 as the comparison reference voltage V5 and supplies the voltage V51 to the comparator 7. Also, in the first period TA, the control unit 4 switches the filter switching circuit 93 to allow the digital signal D12 to be supplied from the serial-parallel converting unit 8 to the filter 91.

When the reset operation is finished, the control unit 4 turns the switch 21 ON and turns the switch 22 OFF in a sampling period T2, thus causing the D/A converting unit 5 to be charged with the analog input voltage V1 supplied to the input terminal TA1 as the voltage V3 to be converted. In addition, the control unit 4 also turns the switch Q11 ON and turns the switch Q12 OFF, thus having the charge voltage V51 for the capacitor C11, corresponding to the analog input voltage V1, supplied as the comparison reference voltage V5 to the comparator 7. Note that in an initial state where the A/D converter 1 starts performing the A/D conversion, the value of the charge voltage V51 is close to the reference voltage for the A/D converter 1.

Thereafter, in an A/D conversion period T3, the control unit 4 makes the A/D converting section 3 perform the A/D conversion while turning the switches 21, 22 OFF.

First, the control unit 4 outputs, to the D/A converting unit 5, a control signal S1 which generates a comparative voltage ((VH−VL)/2) corresponding to a 12-bit digital value such as "100000000000," of which only the most significant bit is "1." At this time, the comparator 7 determines the value of the most significant bit as the target bit by comparing the differential voltage V4 between the voltage V3 to be converted (analog input voltage V1) and the comparative voltage with the comparison reference voltage V5.

In this case, if the differential voltage V4 is equal to or greater than the comparison reference voltage V5, the comparator 7 sets the value of the most significant bit (target bit) at "1" for example. On the other hand, if the differential voltage V4 is less than the comparison reference voltage V5, the comparator 7 sets the value of the most significant bit (target bit) at "0," for example. When determining the value of the bit next to the target bit, the control unit 4 generates, based on the result of comparison made by the comparator 7, a control signal S1 that determines the value of the comparative voltage to be generated by the D/A converting unit 5 and outputs the control signal S1 to the D/A converting unit 5.

For example, if the value of the most significant bit is "1," the control unit 4 outputs a control signal S1, which generates a comparative voltage (3(VH−VL)/4) corresponding to a digital value "110000000000" to the D/A converting unit 5 when determining the value of the bit next to the most significant bit. At this time, the comparator 7 determines the value of the target bit by comparing the differential voltage V4 between the voltage V3 to be converted (analog input voltage V1) and the comparative voltage with the comparison reference voltage V5. When finding the differential voltage V4 equal to or greater than the comparison reference voltage V5, the comparator 7 sets the value of the (MSB−1) bit as the target bit at "1." On the other hand, when finding the differential voltage V4 less than the comparison reference voltage V5, the comparator 7 sets the value of the (MSB−1) bit as the target bit at "0."

On the other hand, if the value of the most significant bit is "0," the control unit 4 outputs a control signal S1, which generates a comparative voltage ((VH−VL)/4) corresponding to a digital value "010000000000" to the D/A converting unit 5 when determining the value of the bit next to the most significant bit. At this time, the comparator 7 determines the value of the target bit by comparing the differential voltage V4 between the voltage V3 to be converted (analog input voltage V1) and the comparative voltage with the comparison reference voltage V5. When finding the differential voltage V4 equal to or greater than the comparison reference voltage V5, the comparator 7 sets the value of the (MSB−1) bit as the target bit at "1." On the other hand, when finding the differential voltage V4 less than the comparison reference voltage V5, the comparator 7 sets the value of the (MSB−1) bit as the target bit at "0."

The values of the respective bits are determined by making the A/D converting section 3 repeat such an operation from the most significant bit through the least significant bit. The comparison results of respective bits are converted by the serial-parallel converting unit 8 into a multi-bit parallel digital signal D12, which is output to the filter circuit 9. In the filter circuit 9, the digital signal D12 is supplied by the filter switching circuit 93 to the filter 91, which outputs a digital signal D1 with noise in the high-frequency band reduced.

When the A/D converting section 3 has performed the operation of comparing the target bit through the least significant bit, the control unit 4 starts performing an operation for an integration period T4. In the integration period T4, the control unit 4 makes the integrator 61 perform an integration operation and then performs the operation of generating the comparison reference voltage V5 for use when the analog input voltage V1 is A/D converted next time.

In the integration period T4, the control unit 4 first outputs a control signal φ0 to turn the switches Q22, Q26 OFF to the integrator 61, thereby turning the switches Q22, Q26 OFF. In this case, the switches Q22, Q26 are ON during the A/D conversion period T3. Thus, at the beginning of the integration period T4, the capacitors C22 and C24 have been charged with the differential voltage V4 between the voltage V3 to be converted and the comparative voltage at a point in time when the successive approximation processing is finished through the least significant bit.

In the integration period T4, the control unit 4 outputs a control signal φ1 to turn the switches Q21, Q24 ON substantially simultaneously with turning the switches Q22, Q26 OFF, thereby turning the switches Q21 and Q24 ON. As a result, the differential voltage V4 between the voltage V3 to be converted and the comparative voltage at the point in time when the successive approximation processing is finished through the least significant bit is integrated by the integrating circuit 61A and the integrated value thus obtained is stored in the capacitor C23.

Next, the control unit 4 turns the switches Q21 and Q24 OFF, samples and holds, in the capacitor C23, the integrated value calculated by the integrating circuit 61A, and then outputs a control signal φ2 to turn the switches Q23, Q25 and Q28 ON, thereby turning the switches Q23, Q25 and Q28 ON. As a result, the integrated value sampled and held by the capacitor C23 is integrated by the integrating circuit 61B on the second stage. In addition, the differential voltage for the least significant bit that has been sampled and held in the capacitor C22 is supplied to the integrating circuit 61B through the feed forward path FF1 and integrated by the integrating circuit 61B. At this time, the integrated value calculated by the integrating circuit 61B is stored in the capacitor C25.

Next, the control unit 4 turns the switches Q23, Q25, and Q28 OFF, samples and holds, in the capacitor C26, the integrated value calculated by the integrating circuit 61B, and then outputs a control signal φ3 to turn the switches Q27, Q29 and Q30 ON, thereby turning the switches Q27, Q29 and Q30 ON. As a result, the integrated value sampled and held by the capacitor C26 is integrated by the integrating circuit 61C on the third stage. In addition, the differential voltage for the least significant bit that has been sampled and held in the capacitor C25 is supplied to the integrating circuit 61C through the feed forward path FF2 and integrated by the integrating circuit 61C. At this time, the integrated value calculated by the integrating circuit 61C is stored in the capacitor C11 via the switching circuit 62.

Next, the control unit 4 turns the switches Q27, Q29, and Q30 OFF and samples and holds, in the capacitor C11, the integrated value calculated by the integrating circuit 61C on the third stage. In this manner, a third-order integration operation is done by the comparison reference voltage generating unit 6 and the third-order integrated value sampled and held in the capacitor C11 is fed back to the comparator 7 as the comparison reference voltage V5 for use when the analog input voltage V1 is A/D converted next time. In other words, the result of integration obtained by the integrator 61 after the analog input voltage V1 has been A/D converted last time during the first period TA is set as the comparison reference voltage V5 for use when the analog input voltage V1 is A/D converted next time during the first period TA. Thus, a successive approximation register A/D converter 1 having a third-order noise shaping characteristic is provided.

Note that the operation of the A/D converter 1 during the second period TB is different from its operation during the first period TA in that the analog input voltage V2 is subjected as the voltage V3 to be converted to A/D conversion. In the sampling period T2 of the second period TB, the switch 21 is turned OFF and the switch 22 is turned ON to have the analog input voltage V2 sampled by the D/A converting unit 5. Also, in the integration period T4, the switch Q11 is turned OFF and the switch Q12 is turned ON to make the capacitor C12 integrate the integrated value calculated by the integrator 61, and the integrated value sampled and held in the capacitor C12 is fed back to the comparator 7 as the comparison reference voltage V5 for use when the analog input voltage V2 is A/D converted next time. Meanwhile, the digital signal D12 output from the serial-parallel converting unit 8 is supplied to the filter 92 via the filter switching circuit 93. In response to the digital signal D12 received, the filter 92 outputs a digital signal D2 with the noise in the high-frequency band reduced.

In this embodiment, two filters 91, 92 associated with the two analog input voltages V1, V2, respectively, are provided. Then, the filter switching circuit 93 supplies the digital signal D12 to the filter 91 or 92 associated with the analog input voltage V1 or V2 selected as the voltage V3 to be converted, thereby reducing the noise in the high-frequency band. As can be seen, a plurality of filters 91, 92 associated with the plurality of analog input voltages V1, V2, respectively, are provided. This achieves the advantage of allowing a plurality of filters 91, 92 associated with the plurality of analog input voltages V1, V2, respectively, to be designed according to the respective frequencies of the analog input voltages V1, V2. Thus, even if the analog input voltages V1, V2 have mutually different frequencies, digital signals D1, D2, generated by converting the analog input voltages V1, V2 into respective digital values, may still be output.

In this embodiment, each of the plurality of capacitors C11, C12 preferably has capacitance which is at least 100 times as large as the quantity of electric charge that would leak via the switch Q11, Q12 during the holding period. As used herein, the "holding period" refers to an interval until an associated one of the plurality of analog input voltages V1, V2 is A/D converted next time. If an electric charge leaks via the switch Q11, Q12 during the holding period, the charge voltage of the capacitor C11, C12 varies, thus causing a variation in the comparison reference voltage V5 for the next A/D conversion. Thus, each of the plurality of capacitors C11, C12 preferably has capacitance which is at least 100 times as large as the quantity of electric charge that would leak via the switch Q11, Q12 during the holding period. This may reduce a variation in the charge voltage V51, V52 even when an electric charge leaks, thus enabling reducing a variation in the comparison reference voltage V5. Note that each of the plurality of capacitors C11, C12 has only to have capacitance which is at least 100 times as large as the quantity of electric charge that would leak via the switch Q11, Q12 during the holding period. The upper limit value of the capacitance may be determined by, for example, the size of the capacitor C11, C12.

(3) Variations

Note that the embodiment described above is only an exemplary one of various embodiments of the present disclosure and should not be construed as limiting. Rather, the exemplary embodiment may be readily modified in various manners depending on a design choice or any other factor without departing from the scope of the present disclosure.

Next, variations of the exemplary embodiment will be enumerated one after another. Note that the variations to be described below may be adopted in combination as appropriate.

In the exemplary embodiment described above, the circuit configurations described for the D/A converting unit 5, the integrator 61, and other components are only examples and may be modified as appropriate.

In the exemplary embodiment described above, the analog input voltages V1, V2 to be supplied to the input terminals TA1, TA2 are output signals of various types of sensors such as acceleration sensors, angular velocity sensors, gyrosensors, or pressure sensors. However, this is only an example and should not be construed as limiting. Alternatively, the analog input voltages V1, V2 may also be voltage signals other than the output signals of such sensors.

In the exemplary embodiment described above, the input switching circuit 2 may be implemented as, for example, a multiplexor.

In the exemplary embodiment described above, the serial-parallel converting unit 8 is provided separately from the filter circuit 9. However, the serial-parallel converting unit 8 is not an essential constituent element. Alternatively, the serial-parallel converting unit 8 may be omitted if the filter circuit 9 is provided with the function of the serial-parallel converting unit.

Furthermore, in the foregoing description of embodiments, if one of two values being compared with each other (e.g., when the differential voltage is compared with the comparison reference voltage) is "equal to or greater than" the other, this phrase may herein cover both a situation where these two values are equal to each other and a situation where one of the two values is greater than the other. However, this should not be construed as limiting. Alternatively, the phrase "equal to or greater than" may also be a synonym of the phrase "greater than" that covers only a situation where one of the two values is over the other. That is to say, it is arbitrarily changeable, depending on selection of a reference value or any preset value, whether the phrase "equal to or greater than" covers the situation where the two values are equal to each other. Therefore, from a technical point of view, there is no difference between the phrase "equal to or greater than" and the phrase "greater than." Similarly, the phrase "less than" may be a synonym of the phrase "equal to or less than" as well.

(Recapitulation)

As can be seen from the foregoing description, an A/D converter (1) according to a first aspect includes an input switching circuit (2) and a successive approximation register A/D converting section (3). The input switching circuit (2) receives a plurality of analog input voltages (V1, V2) and outputs, as a voltage (V3) to be converted, one analog input voltage selected from the plurality of analog input voltages (V1, V2). The A/D converting section (3) performs A/D conversion of converting the voltage (V3) to be converted, supplied from the input switching circuit (2), into a multi-bit digital signal (D11). The input switching circuit (2) selects, when a conversion operation of converting the voltage (V3) to be converted has been performed by the A/D converting section (3), another analog input voltage, as the voltage (V3) to be converted, from the plurality of analog input voltages (V1, V2). The A/D converting section (3) performs the conversion operation on a target bit basis from a most significant bit through a least significant bit. The A/D converting section (3) includes a control unit (4), a D/A converting unit (5), a comparison reference voltage generating unit (6), and a comparator (7). The D/A converting unit (5) generates an analog comparative voltage, corresponding to the target bit, in accordance with a control signal (S1) supplied from the control unit (4). The comparison reference voltage generating unit (6) generates a comparison reference voltage (V5) corresponding to the analog input voltage (V1, V2) selected as the voltage (V3) to be converted. The comparator (7) determines a value of the target bit by comparing a differential voltage (V4) between the voltage (V3) to be converted and the comparative voltage with the comparison reference voltage (V5). The control unit (4) determines, based on a result of comparison made by the comparator (7) with respect to the target bit, the control signal (S1) with respect to a bit next to the target bit. The comparison reference voltage generating unit (6) includes an integrator (61), a plurality of capacitors (C11, C12), and a switching circuit (62). The integrator (61) integrates the differential voltage (V4) in a state where the A/D converting section (3) has performed the conversion operation on the least significant bit. The plurality of capacitors (C11, C12) are provided in association with the plurality of analog input voltages (V1, V2), respectively. The switching circuit (62) selectively connects a capacitor (C11, C12), associated with the analog input voltage (V1, V2) selected as the voltage (V3) to be converted, out of the plurality of capacitors (C11, C12) to an output terminal of the integrator (61). The capacitor (C11, C12), connected to the output terminal of the integrator (61) via the switching circuit (62), out of the plurality of capacitors (C11, C12) is charged with an output voltage of the integrator (61). The comparison reference voltage generating unit (6) uses, as the comparison reference voltage (V5), a charge voltage (V51, V52) for the capacitor, associated with the analog input voltage selected as the voltage (V3) to be converted, out of the plurality of capacitors (C11, C12).

According to this aspect, the input switching circuit (2) selects, when a conversion operation of converting the voltage (V3) to be converted has been performed by the A/D converting section (3), another analog input voltage (V1, V2), as the voltage (V3) to be converted, from the plurality of analog input voltages (V1, V2). Thus, the A/D converter (1) may A/D convert the plurality of analog input voltages (V1, V2) time-sequentially. In addition, each of the plurality of capacitors (C11, C12) is charged with the result of integration performed by the integrator (61) in a situation where an associated analog input voltage (V1, V2) is used as the voltage (V3) to be converted. The charge voltage (V51, V52) for the capacitor (C11, C12) is used as the comparison reference voltage (V5) when the associated analog input voltage (V1, V2) is A/D converted next time. Thus, the conversion error may be reduced by using an integrated value of the conversion error involved with the A/D conversion as the comparison reference voltage (V5) for the next A/D conversion. This enables providing an A/D converter (1) with the ability to A/D convert the plurality of analog input voltages (V1, V2) time-sequentially while reducing the conversion error.

In an A/D converter (1) according to a second aspect, which may be implemented in conjunction with the first aspect, each of the plurality of capacitors (C11, C12) has one terminal thereof connected to a reference voltage for the A/D converter (1). The switching circuit (62) includes a plurality of switches (Q11, Q12) respectively connected between the other terminals of the plurality of capacitors (C11, C12) and the output terminal of the integrator (61).

This aspect enables providing an A/D converter (1) with the ability to A/D convert the plurality of analog input voltages (V1, V2) time-sequentially while reducing the conversion error.

In an A/D converter (1) according to a third aspect, which may be implemented in conjunction with the second aspect, each of the plurality of capacitors (C11, C12) has capacitance which is at least 100 times as large as a quantity of electric charge that leaks via an associated one of the switches during a holding period. The holding period refers to an interval until one analog input voltage (V1, V2), associated with the capacitor (C11, C12), out of the plurality of analog input voltages (V1, V2) is A/D converted next time.

This aspect enables reducing a variation, during the holding period, in charge voltages (V51, V52) to be stored in the plurality of capacitors (C11, C12).

An A/D converter (1) according to a fourth aspect, which may be implemented in conjunction with any one of the first to third aspects, includes a filter circuit (9) that attenuates an RF component of the digital signal (D12) supplied from the A/D converting section (3). The filter circuit (9) includes: a plurality of filters (91, 92) respectively associated with the plurality of analog input voltages (V1, V2); and a filter switching circuit (93). The filter switching circuit (93) supplies the digital signal (D12) to one filter (91, 92), associated with the analog input voltage (V1, V2) selected as the voltage (V3) to be converted, out of the plurality of filters (91, 92).

This aspect achieves the advantage of allowing a plurality of filters (91, 92), respectively associated with the plurality of analog input voltages (V1, V2), to be designed according to the respective frequencies of the plurality of analog input voltages (V1, V2).

In an A/D converter (1) according to a fifth aspect, which may be implemented in conjunction with any one of the first to fourth aspects, the D/A converting unit (5) includes a plurality of capacitors (C1, C2) and a voltage switching circuit (55). Each of the plurality of capacitors (C11, C12) has one terminal thereof connected to an output terminal of the input switching circuit (2). The voltage switching circuit (55) selectively connects, in accordance with the control signal (S1), the other terminal of each of the plurality of capacitors (C1, C2) to either a first voltage (VH) or a second voltage (VL).

This aspect achieves the advantage of allowing the D/A converting unit (5) to be implemented as a simple circuit.

In an A/D converter (1) according to a sixth aspect, which may be implemented in conjunction with any one of the first to fifth aspects, the integrator (61) includes multiple stages of integrating circuits (61A-61C) that perform integration operations sequentially. Each of the multiple stages of the integrating circuits (61A-61C) performs the integration operation using an operational amplifier (OP1-OP3).

This aspect realizes a noise shaping characteristic for shifting noise in a low-frequency band to a high-frequency band by performing integration operations in multiple stages using the multiple stages of integrating circuits (61A-61C).

Note that these are not the only aspects of the present disclosure but various configurations (including their variations) of the control unit (4) included in the A/D converter (1) according to the exemplary embodiment described above may also be implemented as, for example, a method for controlling the control unit (4), a (computer) program, or a non-transitory storage medium on which the program is stored.

Note that the constituent elements according to the second to sixth aspects are not essential constituent elements for the A/D converter (1) but may be omitted as appropriate.

REFERENCE SIGNS LIST

1 A/D Converter
2 Input Switching Circuit
3 A/D Converting Section
5 D/A Converting Unit
6 Comparison Reference Voltage Generating Unit
7 Comparator
9 Filter Circuit
55 Voltage Switching Circuit
61 Integrator
62 Switching Circuit
91, 92 Filter
93 Filter Switching Circuit
C1, C2 Capacitor
C11, C12 Capacitor
D11 Digital Signal
OP1-OP3 Operational Amplifier
Q11, Q12 Switch
S1 Control Signal
V1, V2 Analog Input Voltage
V3 Voltage to Be Converted
V4 Differential Voltage
V5 Comparison Reference Voltage
VH First Voltage
VL Second Voltage

The invention claimed is:
1. An A/D converter comprising:
an input switching circuit configured to receive a plurality of analog input voltages and output, as a voltage to be converted, one analog input voltage selected from the plurality of analog input voltages; and an A/D converting section configured to perform A/D conversion of converting the voltage to be converted, supplied from the input switching circuit, into a multi-bit digital signal, the A/D converting section being a successive approximation register A/D converting section, the input switching circuit being configured to, when a conversion operation of converting the voltage to be converted has been performed by the A/D converting section, select another analog input voltage, as the voltage to be converted, from the plurality of analog input voltages, the A/D converting section being configured to perform the conversion operation on a target bit basis from a most significant bit through a least significant bit, the A/D converting section including:

a control unit;

a D/A converting unit configured to generate an analog comparative voltage, corresponding to the target bit, in accordance with a control signal supplied from the control unit;

a comparison reference voltage generating unit configured to generate a comparison reference voltage corresponding to the analog input voltage selected as the voltage to be converted; and a comparator configured to determine a value of the target bit by comparing a differential voltage between the voltage to be converted and the comparative voltage with the comparison reference voltage, the control unit being configured to determine, based on a result of comparison made by the comparator with respect to the target bit, the control signal with respect to a bit next to the target bit, the comparison reference voltage generating unit including:

an integrator configured to integrate the differential voltage in a state where the A/D converting section has performed the conversion operation on the least significant bit;

a plurality of capacitors provided in association with the plurality of analog input voltages, respectively; and a switching circuit configured to selectively connect a capacitor, associated with the analog input voltage selected as the voltage to be converted, out of the plurality of capacitors to an output terminal of the integrator, the capacitor, connected to the output terminal of the integrator via the switching circuit, out of the plurality of capacitors being charged with an output voltage of the integrator, the comparison reference voltage generating unit being configured to use, as the comparison reference voltage, a charge voltage for the capacitor, associated with the analog input voltage selected as the voltage to be converted, out of the plurality of capacitors.

2. The A/D converter of claim 1, wherein
each of the plurality of capacitors has one terminal thereof connected to a reference voltage for the A/D converter, and
the switching circuit includes a plurality of switches respectively connected between the other terminals of the plurality of capacitors and the output terminal of the integrator.

3. The A/D converter of claim 2, wherein
each of the plurality of capacitors has capacitance which is at least 100 times as large as a quantity of electric charge that leaks via an associated one of the switches during a holding period until one analog input voltage, associated with the capacitor, out of the plurality of analog input voltages is A/D converted next time.

4. The A/D converter of claim 1, comprising a filter circuit configured to attenuate an RF component of the digital signal supplied from the A/D converting section, wherein
the filter circuit includes:
a plurality of filters respectively associated with the plurality of analog input voltages; and
a filter switching circuit configured to supply the digital signal to one filter, associated with the analog input voltage selected as the voltage to be converted, out of the plurality of filters.

5. The A/D converter of claim 1, wherein
the D/A converting unit includes:
a plurality of capacitors, each of the plurality of capacitors having one terminal thereof connected to an output terminal of the input switching circuit; and
a voltage switching circuit configured to selectively connect, in accordance with the control signal, the other terminal of each of the plurality of capacitors to either a first voltage or a second voltage.

6. The A/D converter of claim 1, wherein
the integrator includes multiple stages of integrating circuits configured to perform integration operations sequentially, and
each of the multiple stages of the integrating circuits performs the integration operation using an operational amplifier.

7. The A/D converter of claim 2, comprising a filter circuit configured to attenuate an RF component of the digital signal supplied from the A/D converting section, wherein
the filter circuit includes:
a plurality of filters respectively associated with the plurality of analog input voltages; and
a filter switching circuit configured to supply the digital signal to one filter, associated with the analog input voltage selected as the voltage to be converted, out of the plurality of filters.

8. The A/D converter of claim 3, comprising a filter circuit configured to attenuate an RF component of the digital signal supplied from the A/D converting section, wherein
the filter circuit includes:
a plurality of filters respectively associated with the plurality of analog input voltages; and
a filter switching circuit configured to supply the digital signal to one filter, associated with the analog input voltage selected as the voltage to be converted, out of the plurality of filters.

9. The A/D converter of claim 2, wherein
the D/A converting unit includes:
a plurality of capacitors, each of the plurality of capacitors having one terminal thereof connected to an output terminal of the input switching circuit; and
a voltage switching circuit configured to selectively connect, in accordance with the control signal, the other terminal of each of the plurality of capacitors to either a first voltage or a second voltage.

10. The A/D converter of claim 3, wherein
the D/A converting unit includes:
a plurality of capacitors, each of the plurality of capacitors having one terminal thereof connected to an output terminal of the input switching circuit; and a voltage switching circuit configured to selectively connect, in accordance with the control signal, the other terminal of each of the plurality of capacitors to either a first voltage or a second voltage.

11. The A/D converter of claim 4, wherein
the D/A converting unit includes:
a plurality of capacitors, each of the plurality of capacitors having one terminal thereof connected to an output terminal of the input switching circuit; and
a voltage switching circuit configured to selectively connect, in accordance with the control signal, the other terminal of each of the plurality of capacitors to either a first voltage or a second voltage.

12. The A/D converter of claim 2, wherein
the integrator includes multiple stages of integrating circuits configured to perform integration operations sequentially, and
each of the multiple stages of the integrating circuits performs the integration operation using an operational amplifier.

13. The A/D converter of claim 3, wherein
the integrator includes multiple stages of integrating circuits configured to perform integration operations sequentially, and
each of the multiple stages of the integrating circuits performs the integration operation using an operational amplifier.

14. The A/D converter of claim 4, wherein
the integrator includes multiple stages of integrating circuits configured to perform integration operations sequentially, and
each of the multiple stages of the integrating circuits performs the integration operation using an operational amplifier.

15. The A/D converter of claim 5, wherein
the integrator includes multiple stages of integrating circuits configured to perform integration operations sequentially, and
each of the multiple stages of the integrating circuits performs the integration operation using an operational amplifier.

\* \* \* \* \*